(12) United States Patent
Mauer (10) Patent No.: US 7,369,637 B1
(45) Date of Patent: May 6, 2008

(54) ADAPTIVE SAMPLING RATE CONVERTER

(75) Inventor: Volker Mauer, High Wycombe (GB)

(73) Assignee: Altera Corporation, San Jose, CA (US)

( * ) Notice: Subject to any disclaimer, the term of this patent is extended or adjusted under 35 U.S.C. 154(b) by 742 days.

(21) Appl. No.: 10/861,937

(22) Filed: Jun. 4, 2004

(51) Int. Cl.
*H04L 7/00* (2006.01)
*H04L 25/00* (2006.01)
*H04L 25/40* (2006.01)

(52) U.S. Cl. ............ 375/372; 375/371; 370/914; 341/61

(58) Field of Classification Search .......... 375/371, 375/372, 375; 370/545, 914; 341/118, 61
See application file for complete search history.

(56) References Cited

U.S. PATENT DOCUMENTS

| | | | | |
|---|---|---|---|---|
| 5,878,088 | A * | 3/1999 | Knutson et al. | 375/324 |
| 6,252,919 | B1 * | 6/2001 | Lin | 375/377 |
| 6,636,165 | B2 | 10/2003 | Freidhof | 341/61 |
| 6,819,732 | B1 * | 11/2004 | Savell | 375/377 |
| 7,061,409 | B1 * | 6/2006 | Jantti et al. | 341/61 |
| 7,106,224 | B2 * | 9/2006 | Knapp et al. | 341/61 |
| 2002/0105448 | A1 * | 8/2002 | Freidhof | 341/61 |
| 2002/0109617 | A1 * | 8/2002 | Freidhof | 341/61 |
| 2002/0190880 | A1 * | 12/2002 | McLaughlin et al. | 341/61 |
| 2004/0032350 | A1 * | 2/2004 | Knapp et al. | 341/61 |

OTHER PUBLICATIONS

T. Hentschel and GP Fettweis, "Sample Rate Conversion for Software Defined Radio", IEEE Communicaitons Magazine 38(8): 142-150, Aug. 2000.

* cited by examiner

*Primary Examiner*—Jean B. Corrielus
(74) *Attorney, Agent, or Firm*—Weaver Austin Villeneuve & Sampson LLP (57) ABSTRACT

Apparatus, methods and techniques for adjusting the phase offset used in sampling rate conversion uses a Farrow structure or the like to compensate for clock problems such as "clock jitter" and/or "clock drift" effects, which typically arise where one clock is truly independent of the other. A phase offset adjustment value $\Delta\mu$ based on the measured data flow between clock domains across a transition interface and/or through a buffer is calculated. Where an output FIFO buffer is used, the measured data flow value represents the number of data words written to and read from the FIFO buffer, such as the current number of data words stored in the FIFO buffer or a counter value representing the net number of data words written to the FIFO buffer. The measured data flow value is compared to a target data flow value, which may be a range of values. The phase offset adjustment value may be updated and/or recalculated continuously and/or periodically and is added to or subtracted from the phase offset $\mu$ as necessary. Such systems are useful in software defined radio and the like and may be implemented on a variety of devices, including PLDs.

29 Claims, 10 Drawing Sheets

ADAPTIVE SAMPLING RATE CONVERTER

BACKGROUND OF THE INVENTION

1. Field of the Invention

This invention relates generally to designing systems for digital signal processing and the like. More specifically, the present invention relates to compensating for clock drift and jitter in Farrow based sampling rate conversion. The present invention can be used in connection with programmable or otherwise configurable devices, including programmable logic devices.

2. Description of Related Art

In many instances, electronic design automation (EDA) includes use of components, blocks, etc. that employ distinct clocks and sampling rates. The well known Farrow structure provides a means of implementing digital sampling rate conversion on a parameterizable hardware platform, enabling adaptation of a converter to different rate change factors. Prior sampling rate converters using the Farrow structure can only convert the sampling rate when there is a fixed relationship between input sampling rate and output sampling rate, as is the case when both clocks are derived from the same phase-locked loop (PLL). When one clock drifts slightly from its nominal frequency, the Farrow structure will start to skip samples, introducing distortion in the sampled data stream.

For example, a first (for example, input) nominal sampling rate is 30 kHz. This first clock's actual sampling rate also is 30 kHz. The second (for example, output) clock's nominal sampling rate is 20 kHz; but the second clock's actual sampling rate is 18 kHz. A Farrow structure converter will write data to an output (for example, a FIFO buffer) using a nominal phase offset of 2/3, based on the first and second nominal sampling rates. However, because the second clock's actual sampling rate is 18 kHz, excess data will accumulate at the converter's output, eventually causing valid data to be overwritten when the buffer overflows. In a case where the second actual sampling rate is 22 kHz, a different problem arises. In that case, the second clock will read data out from the output faster than the data is being written, leading to buffer "leaking" and a depletion of data in the FIFO until it is empty. Both of these types of scenarios lead to serious problems for the device(s) using the converted data downstream.

Figure 1:
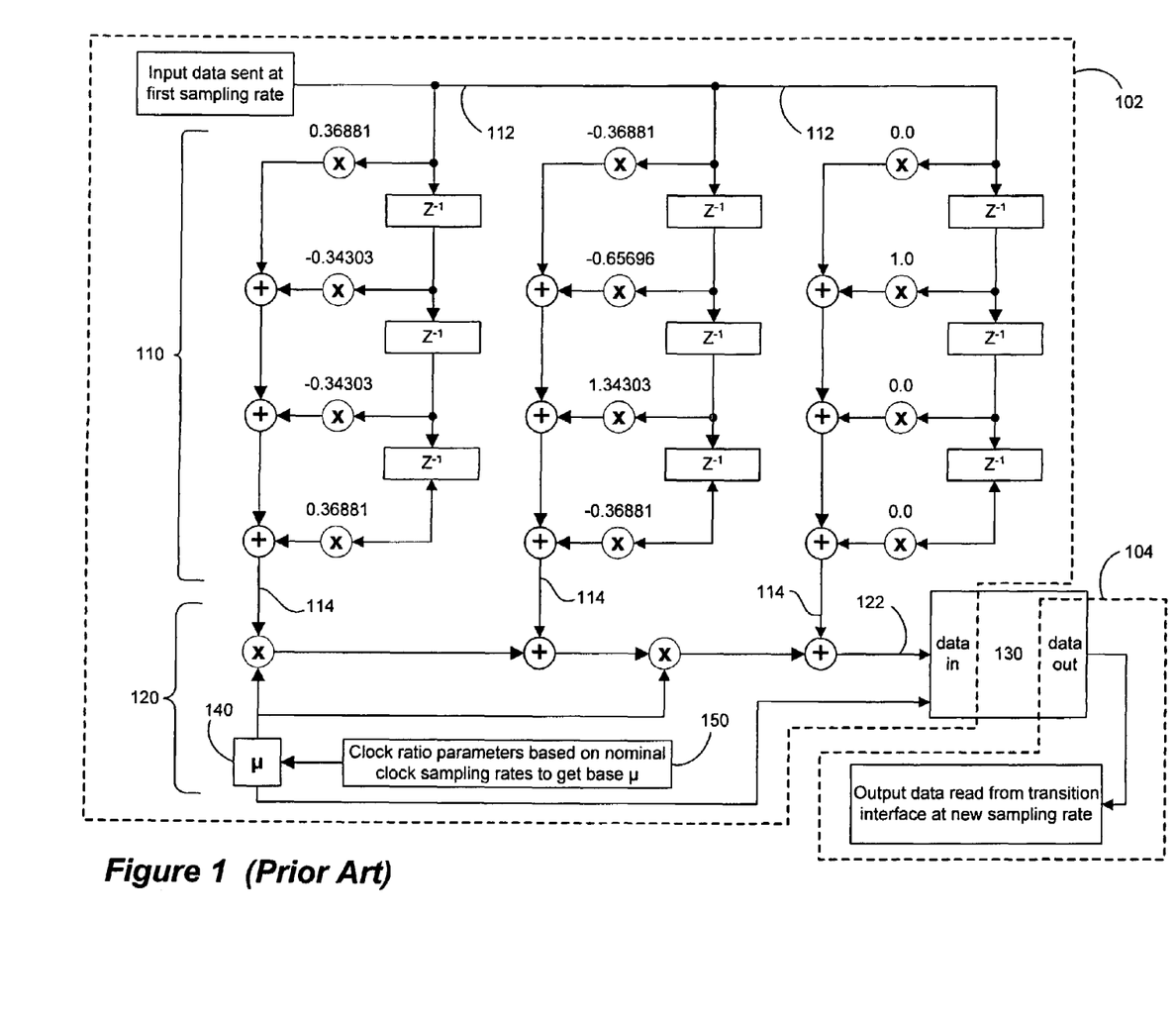
FIG. 1 is a schematic diagram showing a prior Farrow structure used in connection with a polyphase filter.

FIG. 1 is a schematic showing a prior Farrow structure used in connection with a polyphase filter. The view of FIG. 1 is divided into two clock (sampling rate) domains. A first domain 102 operates at a first clock rate, while the second domain 104 operates at a second clock rate. These boundaries do not actually exist, but are provided as conceptual guides for purposes of this disclosure. Data using the first clock rate is converted by a Farrow structure, written to the Farrow structure output and subsequently read out into the second clock domain 104.

In the illustrative system of FIG. 1, a polyphase filter 110 provides 3 separately filtered versions of the input signal 112. Farrow structure combiner 120 receives signals 114 as its input, combines the 3 phases and generates the desired result at its output 122. Data converted to the second clock sampling rate at Farrow structure output 122 is delivered to a sampling rate transition interface 130 (which could be a device, such as a FIFO buffer, which would use a "wr" control value for writing valid converted data to the buffer and a "rd" value for reading valid converted data from the buffer), where the data becomes accessible to the second sampling rate domain 104.

To assist the Farrow combiner 120 in converting sampling rates, a phase offset ($\mu$) generator 140 uses a phase offset $\mu$ to correct for phase differences due to the different clock/sampling rates and to control writing of valid data to the transition interface 130 (for example, by using a "wr" value in connection with a FIFO buffer). Strictly speaking, $\mu$ is the phase difference between the input phase and the desired output phase of Farrow structure 120. It typically is the difference between the two sampling rates (counter values), scaled to the range of 0 to 1 (where 1 represents a full phase cycle). In the example of FIG. 1, the phase offset is determined and supplied by a phase offset calculator 150.

In a sampling rate conversion of 10/9 (that is, where 9 samples will be read as output for every 10 samples written as input to a FIFO, for example), $\mu$ may have a value that varies from 1 down to 0. When $\mu$ is 1, the output is delayed by exactly one sample. As $\mu$ decreases toward 0, the output moves closer to the values that would be presented if no IL offset was used at all, a delay of 0 samples.

Eventually, after 10 clock cycles in this example, there is an overflow and $\mu$ resets to 1. When this happens the same sample is obtained twice. Every time this happens, the superfluous sample is marked for deletion. Thus, using $\mu$ based on the 10/9 conversion rate, for each 10 samples at the input, 9 valid samples plus one invalid sample are generated at the output. When the valid output samples are written as inputs to transition point 130, 9 samples are written and the single invalid sample is skipped. On the output side of point 130, the data can now be read at 9/10 of the input sampling rate, receiving a signal of the same frequency, sampled at 9/10 of the input sampling rate.

The problem with these earlier systems is that the clock ratios and/or sampling rates are assumed to be and/or are defined as constants (their respective nominal sampling rates)—that is, sampling/clock rates that match their nominal rates and do not vary relative to one another. No accommodation and/or compensation is or can be made for a drift over time of the input and/or output clock and/or any variance from the clocks' stated nominal rates. As noted above, when such drifts and/or variances do occur (and they do), the FIFO overruns or underruns, depending on which clock is faster. Thus, where the actual rates differ from the nominal rates even marginally, as typically is the case when two clocks are not based on the same PLL, FIFO overruns or underruns occur, which significantly degrades the quality of the produced sample stream.

Current systems are intended to work with sample clocks that are derived from the same PLL. Using just one PLL means that the two clocks cannot drift in respect to each other. A small amount of phase jitter is allowed, and is easily compensated for in the FIFO. Data samples are written into the FIFO until the FIFO is half full, before any data is read. When the FIFO is half full, data are written in and read out. Phase jitter means that for a short period of time, the clock ratio will seem to increase, but this will be followed by a period where the ratio will seem slower. However, over a longer period of time, on average, the two clocks have a constant ratio. If the ratio is temporarily increased, more words are written into the FIFO than read from it, so the number of words within the FIFO will increase. However, this will be followed by a period where the ratio decreases, and the number of words within the FIFO also decreases. If the FIFO contains 64 entries, the number of samples in the FIFO, once the system is initialized, will be 32±1. If the jitter increases, this could be changed to 32±2 up to 32±n, where n depends on the severity of the jitter.

If the clocks are truly independent, the signal is resampled and filtered, which introduces loss in precision. Often the problem is avoided by reprogramming the PLL to the required sampling rate, thus avoiding the need to have two separate sampling rates. In summary, a FIFO of finite length can be used to compensate for a finite amount of jitter, but it cannot be used in the case where one clock drifts in respect to the second clock, because it would need to be of infinite length.

Systems, methods, products and techniques that permit ongoing compensation for clock drift and/or jitter in sample conversion would represent a significant advancement in the art. Moreover, providing such compensation with a design that is simple and can be easily implemented in existing Farrow combiner architectures likewise would constitute a significant advancement in the art.

BRIEF SUMMARY OF THE INVENTION

Embodiments of the present invention include apparatus, methods and techniques for adjusting the phase offset used in sampling rate conversion using a Farrow structure or the like. These methods and techniques can be implemented in computers and other hardware devices, including programmable devices such as PLDs, Moreover, the present invention includes computer program products that can program computers to implement such methods and techniques.

More specifically, the present invention provides techniques, methods and apparatus that compensate for clock problems such as "clock jitter" and/or "clock drift" effects, which typically arise where one clock is truly independent of the other. By using the difference between the two clocks' actual sampling rates (as opposed to their nominal sampling rates), the present invention compensates for drift of either clock or both clocks, thus compensating for the "relative drift" of the clocks.

This is done by calculating a phase offset adjustment value $\Delta\mu$ that is based on the measured data flow between clock domains (for example, across a transition interface and/or through a buffer). Where an output FIFO buffer is used, the measured data flow value represents the number of data words written to and read from the FIFO buffer, such as the current number of data words stored in the FIFO buffer or a counter value representing the net number of data words written to the FIFO buffer. The measured data flow value is compared to a target data flow value (which may be a range of values). The phase offset adjustment value may be updated and/or recalculated continuously and/or periodically and is added to or subtracted from $\mu$ as necessary.

A sampling rate converter according to one embodiment of the present invention includes a Farrow structure having a phase offset generator, where the Farrow structure is coupled to an output transition interface such as a FIFO buffer. A phase offset adjuster is coupled to the transition interface and to the phase offset generator and measures data flow across the transition interface to generate a measured data flow value on which a phase offset adjustment value is based. The phase offset adjustment value is added to or subtracted from the phase offset by the phase offset generator. The nominal sampling rates can be used to set the phase offset generator initially.

In one embodiment of the present invention, the phase offset adjuster has a collector that the measured data flow value from the transition interface and provides it to a comparator, which calculates the difference between the measured data flow value and a target data flow value. If the measured data flow value differs sufficiently from the target data flow value, a phase offset adjustment value generator calculates a phase offset value based on a variance of the measured data flow value from the target data flow value and provides that adjustment value to the phase offset generator. In this type of configuration, the measured data flow and target data flow values can be data balance values representing the number of data words held in the FIFO buffer.

In another embodiment of the invention, the phase offset adjuster uses a counter coupled to the transition interface (for example, a FIFO buffer). The counter maintains a measured data flow value by incrementing the measured data flow value for each data word written to the FIFO and decrementing the measured data flow value for every data word read from the FIFO. A calculates a phase offset adjustment value based on the variance of the measured data flow counter value from a target data flow value. Any of these embodiments can be implemented on a PLD, a computer, a computer system or any other suitable hardware device.

Methods for adjusting the operation of a sampling rate converter according to the present invention utilize setting a phase offset value for the Farrow structure, measuring a data flow value at the transition interface, generating a phase offset adjustment value based on a variance between the measured data flow value and a target data flow value, and adjusting the phase offset value by adding or subtracting the phase offset adjustment value. In some embodiments, the measured data flow value may be representative of the difference between the nominal input sampling rate and an actual input sampling rate, the difference between the nominal output sampling rate and an actual output sampling rate, and/or other differences between nominal operational values pertaining to sampling rates and the actual sampling rates employed. Other method embodiments of the invention generally track the apparatus descriptions provided above. One or more steps may be performed iteratively to allow updating of the phase offset adjustment value to reflect changes in operation and/or ongoing drifting of one or more clock rates. A computer program product utilizes program instructions for adjusting the operation of a sampling rate converter in general accordance with the methods discussed above as well.

Further details and advantages of the invention are provided in the following Detailed Description and the associated Figures.

BRIEF DESCRIPTION OF THE SEVERAL VIEWS OF THE DRAWING

The present invention will be readily understood by the following detailed description in conjunction with the accompanying drawings, wherein like reference numerals designate like structural elements, and in which.

DETAILED DESCRIPTION OF THE INVENTION

The following detailed description of the invention will refer to one or more embodiments of the invention, but is not limited to such embodiments. The detailed description is intended only to be illustrative. Those skilled in the art will readily appreciate that the detailed description given herein with respect to the Figures is provided for explanatory purposes as the invention extends beyond these limited embodiments.

Embodiments of the present invention will be explained in connection with various specific devices, circuits, applications, etc. herein. However, these references are for purposes of illustration only and are not intended to limit the present invention in any way. For example, one or more embodiments of the present invention will be explained in connection with programmable logic devices (PLDs) and/or other specific hardware to illustrate the present invention. However, the invention is widely applicable to other devices and in other environments. Moreover, the benefits of embodiments of the present invention will be explained and illustrated in connection with a polyphase filter system. However, embodiments of the present invention may be used in a wide variety of functions and/or applications.

The present invention provides techniques, methods and apparatus that compensate for clock problems, including at least two particular types—instances of "clock jitter" and/or "clock drift" effects, where one clock's sampling rate or both clocks' sampling rates vary with time—and instances where one clock's sampling rate or both clocks' sampling rates differ from their nominal rates. These types of problems typically arise where one clock is truly independent of the other. By using the difference between the two clocks' sampling rates, embodiments of the present invention can compensate for drift of either clock or both clocks, thus compensating for the "relative drift" of the clocks. In these embodiments, the first clock domain is used as a reference clock for ease of implementation. This is done by calculating a phase offset adjustment value, $\Delta\mu$, based on the measured data flow between clock domains (for example, across a transition interface and/or through a buffer). Where an output FIFO buffer is used, the measured data flow can be a value representing the number of data words written to and read from the FIFO buffer. The phase offset adjustment value may be updated and/or recalculated continuously and/or periodically and is added to or subtracted from $\mu$ as necessary. The $\Delta\mu$ phase offset adjustment value and any measured data flow on which it is based can be derived in various ways. In one embodiment, $\Delta\mu$ is based on a variance from a target data flow value that is a number of words held in an output buffer (such as a FIFO) of a sampling rate converter. The phrases "coupled to" and "connected to" and the like are used herein to describe a connection between two elements and/or components and are intended to mean coupled either directly together, or indirectly, for example via one or more intervening elements. In another embodiment, the net gain/loss in data word count in a FIFO is monitored (for example, by a counter maintaining a measured data flow value) and used as a scaled phase offset adjustment $\Delta\mu$ applied to $\mu$.

The sampling rate converter of the present invention is useful in a wide variety of settings and applications. It is particularly useful in a system that is a collection of building blocks from different standards (for example, "software defined radio" and other similar applications and/or systems). Sampling rate conversion also is applicable in a number of other areas, such as digital entertainment/multimedia applications, where again a number of different standards defining different sampling rates coexist and must be combined into an integrated system. Each standard typically defines its own sampling rate. Any uses combining these building blocks working at different sampling rates will need sampling rate conversion. Embodiments of the present invention provide these conversions with minimum loss of precision and cover situations using completely independent clock rates.

If the clocks used for sampling in two clock rate domains are truly independent, one clock may vary from its nominal clock rate used in defining 11 as a nominal phase offset. For example, if the actual sampling rate of the output (second) sampling clock is faster than its nominal sampling rate (that is, it reads or withdraws data from the FIFO faster than specified), the FIFO will gradually empty, and eventually "underruns" will occur, meaning that invalid values would be read from the FIFO. Alternatively, if the actual sampling rate of the output sample clock is slower than its nominal sampling rate used to write data to the FIFO, the FIFO will fill completely and "overflows" will occur, meaning that samples are skipped or overwritten. Both problems are detrimental to the quality of the sample stream.

Some embodiments of the present invention, used to prevent overruns and underruns, monitor the inflow and outflow of words to and from a FIFO buffer. This can be done in a variety of ways. For example, a data word count may be used as a target data flow value, a number or range of data words that the FIFO should ideally maintain as a balance while data is written to and read from the FIFO over time. The number of words present in the FIFO can be easily generated after initialization by having a counter increment on every write and decrement on every read of the FIFO, thus maintaining a running "balance" of the words present in the FIFO. Some functionalities may provide information that can be used in these embodiments (for example, the number of "used" words is an output from the FIFO Megafunction available from Altera Corporation of San Jose, Calif.).

If the word balance in the FIFO exceeds a programmable threshold (say 34 when the nominal load is 32), then the actual output sampling rate is too slow (or the input sampling rate too fast), so the distance between output samples needs to be increased slightly. This can be accomplished by increasing $\mu$ by a suitable amount as a phase offset adjustment $\Delta\mu$. The distance between output samples is thus increased and, on average, there will be fewer words written to the FIFO. Alternatively, if the number of words in the FIFO falls below a threshold (say 30), a phase offset adjustment $\Delta\mu$ can be subtracted from $\mu$.

Figure 2:
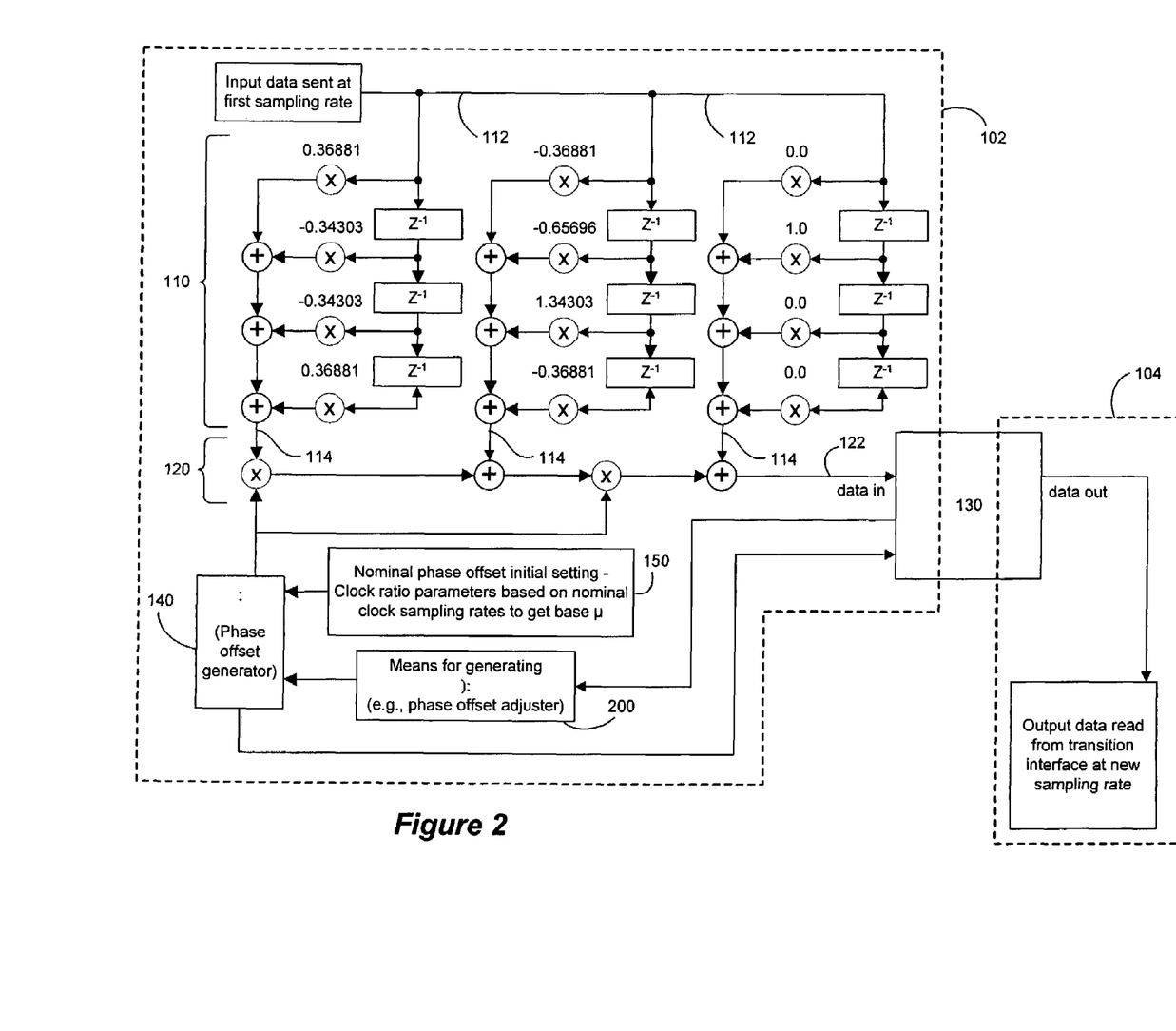
FIG. 2 is a schematic diagram showing one embodiment of the present invention that can be implemented in and/or as apparatus such as a semiconductor device (for example, a PLD or ASIC).

FIG. 2 shows one embodiment of the present invention that can be implemented in and/or as apparatus such as a semiconductor device (for example, a PLD or ASIC). Moreover, the configuration of FIG. 2 can implement one or more of the method embodiments of the present invention. The polyphase filter 110 of FIG. 1 is shown again, with input signal 112 and output 114, the output 114 being the input for Farrow structure 120. The Farrow combiner 120 likewise is the same, with the exception of means 200 for generating Δμ according to one or more embodiments of the present invention. The phase offset adjustment generating means 200 may be a phase offset adjuster in some embodiments of the present invention.

The phase offset generator 140 still provides a phase offset μ to the Farrow combiner as in the earlier system. Generator 140 gets its initial, nominal phase offset value for μ from the same type of calculator 150 used in the earlier system as well. However, instead of μ being a static value, as it was in the system of FIG. 1 and other prior systems, a phase offset adjustment Δμ may be provided by a phase offset adjuster, such as Δμ generating means 200. Phase offset adjustment Δμ can be generated in various ways using various components and techniques.

Figure 3:
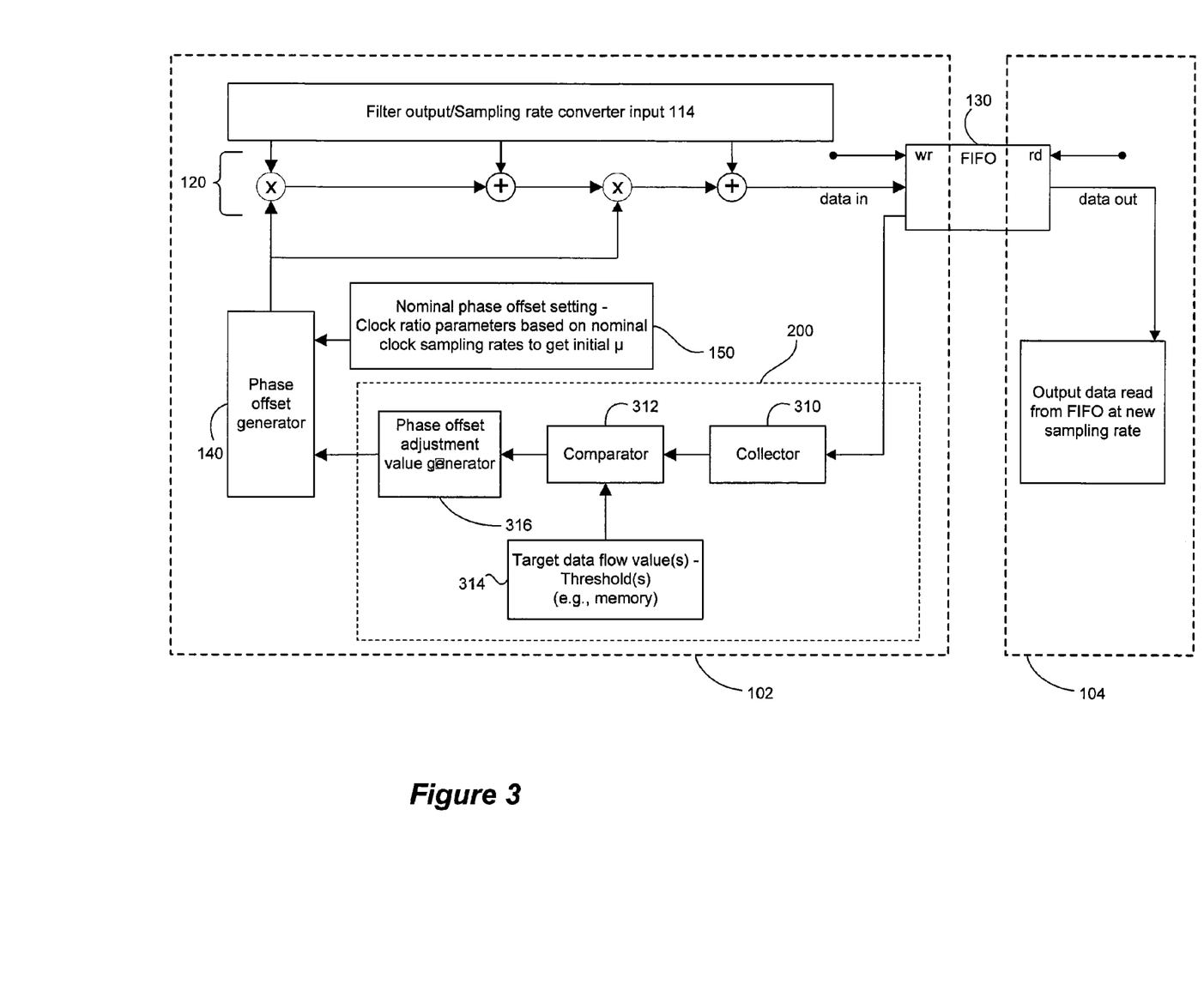
FIG. 3 is a schematic diagram showing one embodiment of a phase offset adjuster used in connection with a Farrow structure for converting sampling rates.

One of these is shown in FIG. 3, in which the transition interface 130 is a FIFO buffer. Data words from the first clock domain 102 are written to the FIFO 130 and are later read from the FIFO 130 by the second clock domain 104. At any given point in time in the example of FIG. 3, FIFO 130 is supposed to hold a target of 50 data words. In this example, a tolerance of ±2 data words is tolerated, so that the FIFO 130 may acceptably hold from 48 to 52 words (for example, to allow for minimal phase jitter and/or minor write/read timing differences). This range of 48 to 52 words is the target data flow value in this case.

The number of words held as the data balance of FIFO 130, which represents the data flow through the buffer 130, is periodically collected by a collector 310. A comparator 312 then compares the measured data flow value collected from FIFO buffer 130 with a target data flow value, which may be obtained from a memory 314. The target data flow value may be a single number or quantity or may be a range of values, such as an acceptable range of data flow values. Comparator 314 determines any variance from the permitted value/range (for example, in the present illustration, 48≦data balance≦52) and forwards a value based on a variance to a phase offset adjustment value generator 316, which scales the variance (for example, by dividing the variance by 50, the target data balance value) and provides this scalar value as Δμ to be added to or subtracted from the current value of μ at phase offset generator 140, thus increasing or decreasing the space/time between words being written to FIFO 130 and effectively slowing down or speeding up the inflow of data words into the FIFO 130.

Figure 4:
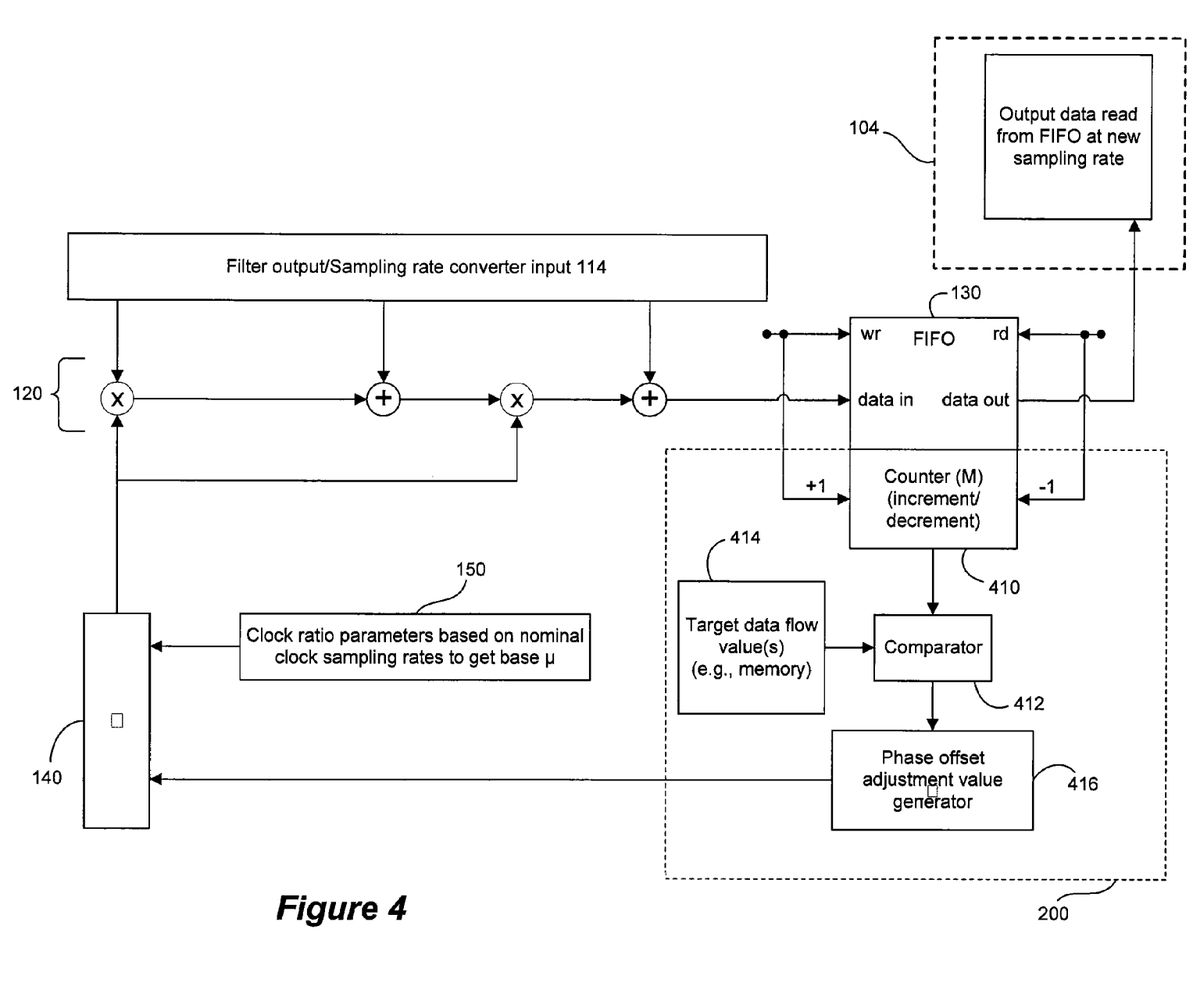
FIG. 4 is a schematic diagram showing another embodiment of a phase offset adjuster used in connection with a Farrow structure for converting sampling rates.

In another embodiment shown in FIG. 4, the means 200 for generating Δμ uses a counter 410 coupled to the FIFO 130 and configured to maintain a measured data flow value M. Counter 410 may actually be contained within buffer 130 or may be an external counter. Every time a data word is written to the buffer 130, the value of M is increased by 1. Whenever a data word is read from the buffer 130, M decreases by 1. Ideally, if the clocks' actual sampling rates are the same as their nominal sampling rates (used to produce the initial, nominal value of μ), M will generally remain 0. However, over time, if more words are written to buffer 130 than are read, M will increase. Similarly, if more words are read from buffer 130 than are written to it, M will decrease. The magnitude of M can be evaluated by a comparator 412, which may again use a target data flow value, which may be obtained from a memory 414. If M exceeds a prescribed threshold or target data flow value (which, again, may be a single value or range of values), a phase offset adjustment value Δμ will be generated by phase offset adjustment value generator 416. In some cases, unit 416 may scale the magnitude value of M and generate an appropriate μ that will be added to or subtracted from μ to adjust the timing of data at the output of Farrow structure 120.

Finally, in another embodiment of the present invention, Δμ may be a constant that can be added to and/or subtracted from μ iteratively, until a suitable flow of data between clock domains is achieved. This technique avoids the need to calculate a specific value for Δμ, but does not guarantee fast adjustment of μ to accommodate discrepancies in the actual clock sampling rates.

Figure 5:
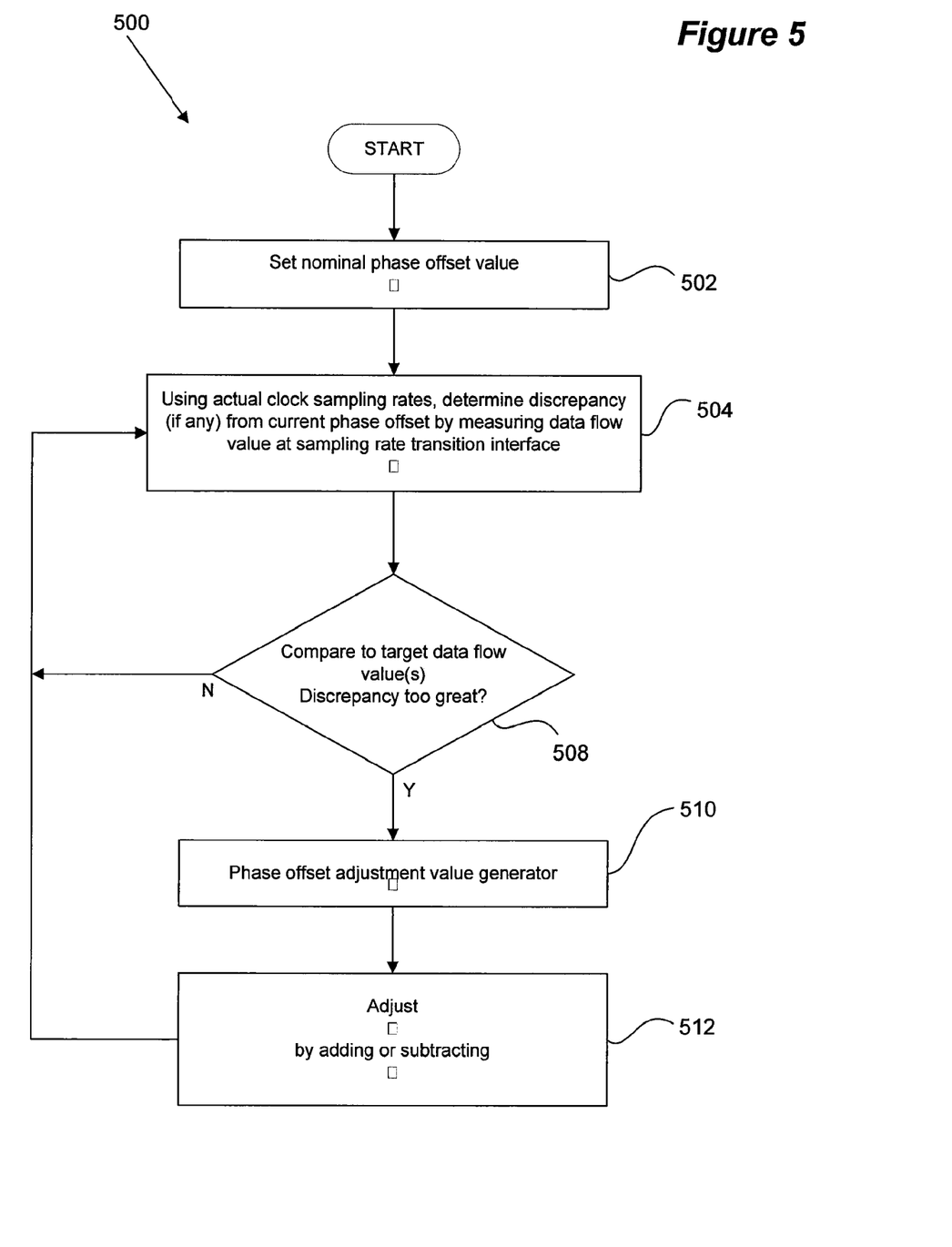
FIG. 5 is a flow diagram showing a method according to one embodiment of the present invention.

A method 500 according to one embodiment of the present invention is shown in FIG. 5. After starting, the nominal phase offset value μ is set at 502, based on the nominal sampling rates of the clock domains. The measured data flow value is obtained at 504, and any discrepancy from the current μ is determined using the measured actual sampling rates (for example, by considering data written to and read from a FIFO buffer). The magnitude of any discrepancy is compared to a target data flow or threshold value at decision 508. If a difference is insubstantial (that is, within the acceptable range of measured data flow values), the system returns to checking for drift or other variations from the nominal or adjusted operation of the system. If, however, the variance from nominal or adjusted operation is too great, a phase offset adjustment value Δμ is generated at 510 and used at 512 to adjust the then current phase offset μ.

Figure 6:
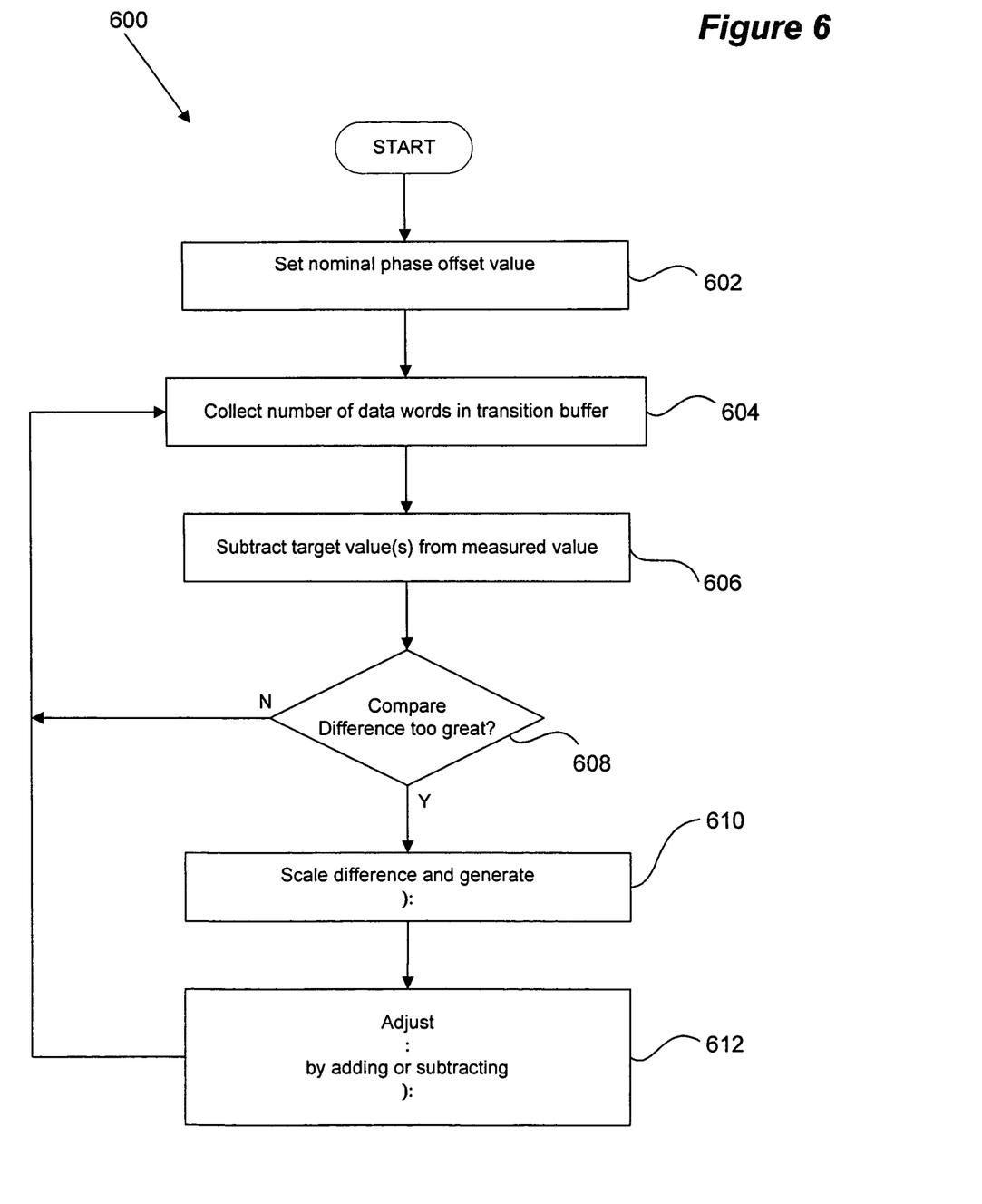
FIG. 6 is a flow diagram showing another method according to one embodiment of the present invention.

Another method 600 according to one embodiment of the present invention is shown in FIG. 6. After starting, the nominal phase offset value μ is set at 602. The number of data words in a transition buffer is collected at 604 as the measured data flow value. One or more target data flow values are subtracted from the measured data word count at 606. If the difference between the target value and measured data word count is within permitted tolerance(s), the system continues to operate, again measuring the data word count in the transition interface FIFO buffer as appropriate. If, however, the difference between the target value and measured data word count is too great, the difference is scaled and a phase offset adjustment value Δμ is generated at 610. Finally, μ is adjusted at 612 using Δμ and the system returns to checking the transition interface buffer word count at 604 as appropriate.

Figure 7:
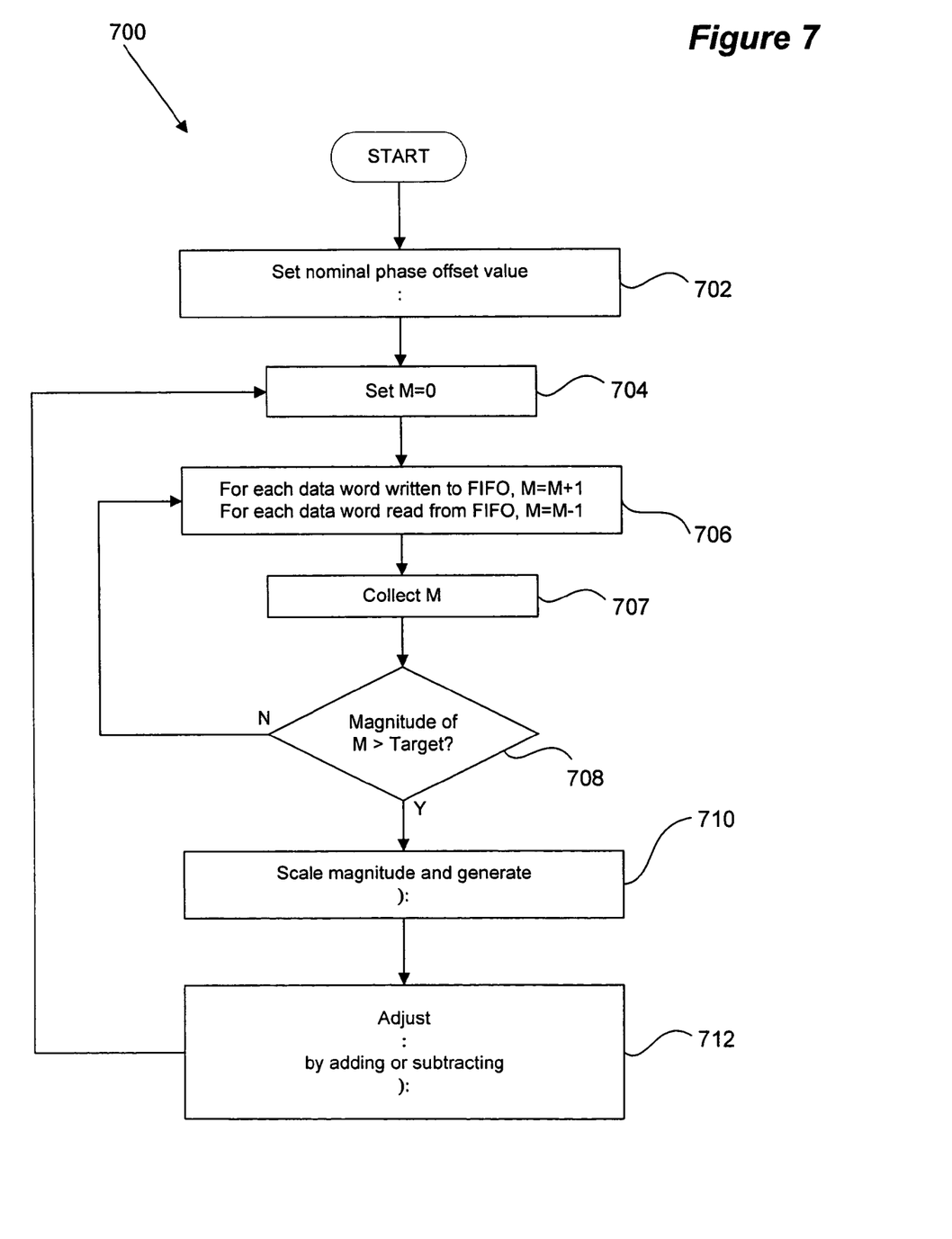
FIG. 7 is a flow diagram showing yet another method according to one embodiment of the present invention.

Finally, one other method 700 according to another embodiment of the present invention is presented in FIG. 7. After starting, the nominal phase offset value μ is set at 702. A counter sets its measured data flow counter value M to 0 at 704. M then is incremented or decremented at 706, depending on whether a data word is written to a FIFO buffer or read from it. M is collected at 707 and the magnitude of M is compared to a target data flow value or threshold at decision 708. If the magnitude of M is not too great, counting continues at 706. If, however, the magnitude of M is sufficiently large, that value is scaled and a phase offset adjustment Δμ is generated at 710. Finally, μ is adjusted at 712 using Δμ and the system resets by setting M to zero at 704 and continuing its counting at 706.

Figure 8:
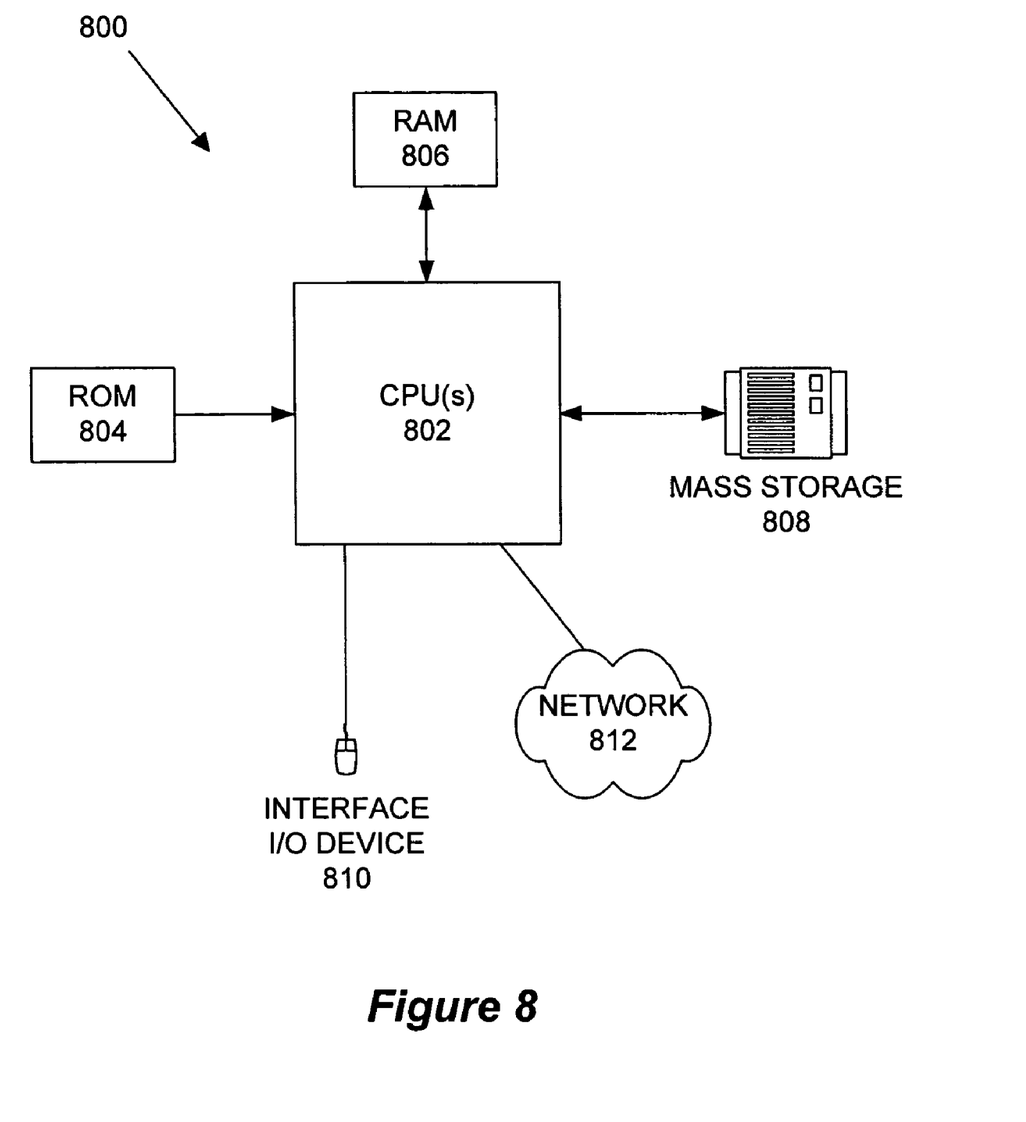
FIG. 8 is a block diagram of a typical computer system suitable for implementing an embodiment of the present invention.

FIG. 8 illustrates a typical computer system that can be used in connection with one or more embodiments of the present invention. The computer system 800 includes one or more processors 802 (also referred to as central processing units, or CPUs) that are coupled to storage devices including primary storage 806 (typically a random access memory, or RAM) and another primary storage 804 (typically a read only memory, or ROM). As is well known in the art, primary storage 804 acts to transfer data and instructions uni-directionally to the CPU and primary storage 806 is used typically to transfer data and instructions in a bi-directional manner. Both of these primary storage devices may include any suitable computer-readable media described above, including a computer program product comprising a machine readable medium on which is provided program instructions according to one or more embodiments of the present invention. A mass storage device 808 also is coupled bi-directionally to CPU 802 and provides additional data storage capacity and may include any of the computer-readable media described above, including a computer program product comprising a machine readable medium on which is provided program instructions according to one or more embodiments of the present invention. The mass storage device 808 may be used to store programs, data and the like and is typically a secondary storage medium such as a hard disk that is slower than primary storage. It will be appreciated that the information retained within the mass storage device 808, may, in appropriate cases, be incorporated in standard fashion as part of primary storage 806 as virtual memory. A specific mass storage device such as a CD-ROM may also pass data uni-directionally to the CPU.

CPU 802 also is coupled to an interface 810 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 802 optionally may be coupled to a computer or telecommunications network using a network connection as shown generally at 812. With such a network connection, it is contemplated that the CPU might receive information from the network, or might output information to the network in the course of performing the above-described method steps. The above-described devices and materials will be familiar to those of skill in the computer hardware and software arts.

The hardware elements described above may define multiple software modules for performing one or more steps and/or operations according to embodiments of the present invention. For example, instructions for running a power consumption estimation program, a design tool or any other appropriate program may be stored on mass storage device 808 or 804 and executed on CPU 802 in conjunction with primary memory 806. In synthesizing a design from a simulation version, a user may use a compiler to generate the design for implementation on hardware.

Figure 9:
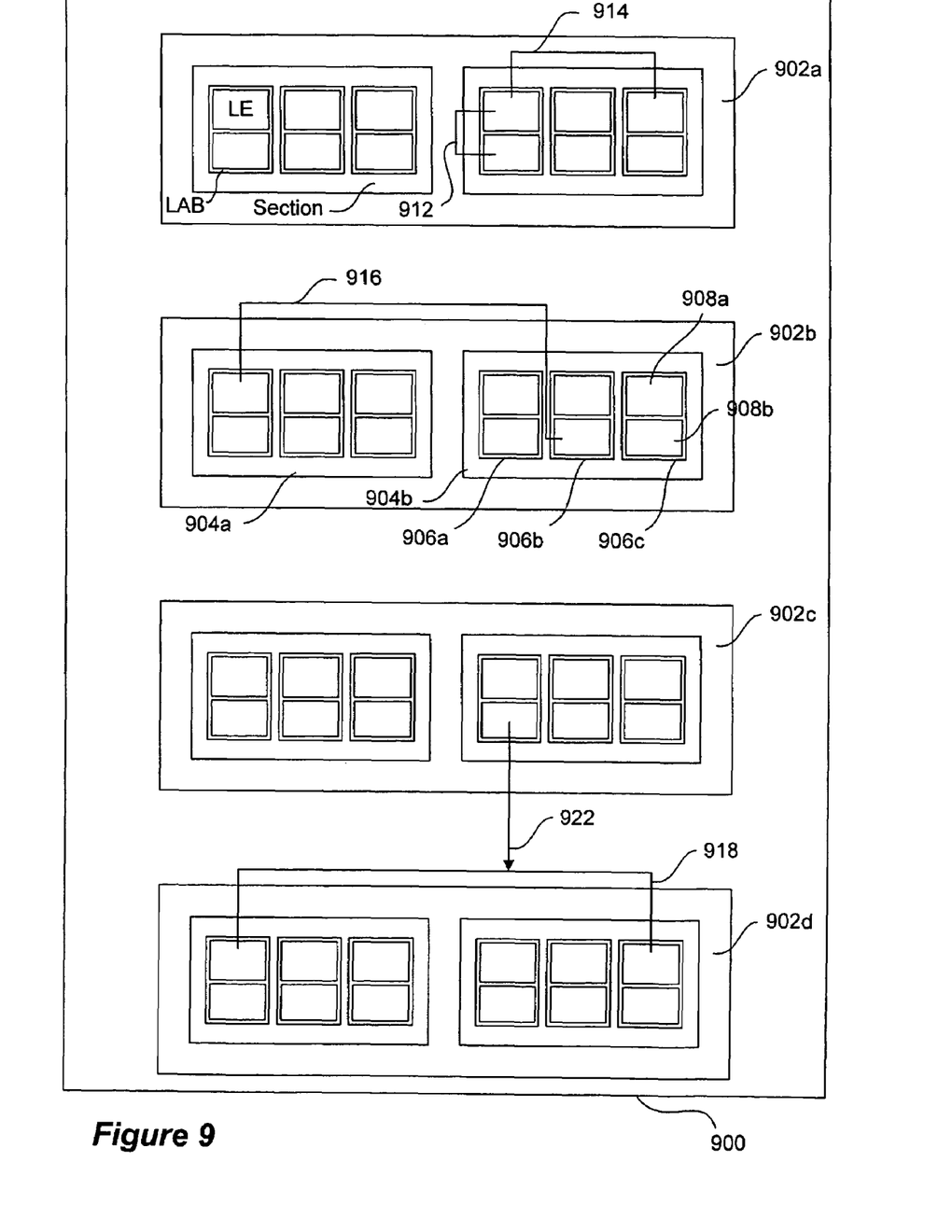
FIG. 9 is an idealized block representation of the architecture of an arbitrary hardware device, including interconnects, which may be employed in fitting gates from a synthesized sub-netlist generated in accordance with this invention.

The form of a compiled design according to one or more embodiments of the present invention may be further understood with reference to a hypothetical target hardware device having multiple hierarchical levels. Such a hardware device is represented in FIG. 9. This idealized representation roughly conforms to the layout of a FLEX 10K programmable logic device available from Altera Corporation of San Jose, Calif. In FIG. 9, a programmable logic device 900 is segmented into a plurality of "rows" to facilitate interconnection between logic elements on a given row. In the hypothetical example shown, there are four rows: 902a, 902b, 902c, and 902d.

Each row of programmable logic device 900 is further subdivided into two "half-rows." For example, row 902b is shown to contain a half-row 904a and a half-row 904b. The next lower level of the hierarchy is the "logic array block" (LAB). Half-row 904b, for example, contains three LABs: an LAB 906a, an LAB 906b, and an LAB 906c. Finally, at the base of the of the hierarchy are several logic elements. Each such logic element exists within a single logic array block. For example, LAB 906c includes two logic elements: a logic element 908a and a logic element 908b.

In short, PLD 900 includes four hierarchical levels: (1) rows, (2) half-rows, (3) LABs, and (4) logic elements (LEs). Any logic element within PLD 900 can be uniquely specified (and located) by specifying a value for each of these four levels of the containment hierarchy. For example, logic element 908b can be specified as follows: row (2), half-row (2), LAB (3), LE (2). To fit a logic design onto a target hardware device such as that shown in FIG. 9, a synthesized netlist is divided into logic cells (typically containing one or more gates) which are placed in the various logic elements as uniquely defined above. Thus, each logic cell from the synthesized netlist resides in a unique single logic element.

Often, a multi-level hardware hierarchy such as that shown in PLD 900 includes multiple levels of routing lines (interconnects). These connect the uniquely placed logic cells to complete circuits. In PLD 900, for example, four levels of interconnect are provided, one for each of the four hierarchy levels. First a local interconnect such as interconnect 912 is employed to connect two logic elements within the same LAB. At the next level, a LAB-to-LAB interconnect such as interconnect 914 is employed to connect two LABs within the same half-row. At the next higher level, a "global horizontal" interconnect is employed to connect logic elements lying in the same row but in different half-rows. An example of a global horizontal interconnect is interconnect 916 shown in row 902b. Another global horizontal interconnect is shown as interconnect 918, linking logic elements within row 902d. Finally, a "global vertical" interconnect is employed to link a logic element in one row with a logic element in a different row. For example, a global vertical interconnect 922 connects a logic element in the first LAB of the second half-row of row 902c to two separate logic elements in row 902d. In the embodiment shown, this is accomplished by providing global vertical interconnect 902 between the above-described logic element in row 902c to global horizontal interconnect 918 in row 902d. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths must be evaluated to determine which is best for the design being fit. The interconnect structure and overall architecture of the Altera FLEX 10K family of PLDs is described in much greater detail in U.S. Pat. No. 5,550,782, issued Aug. 27, 1996, naming Cliff et al. as inventors, and entitled "PROGRAMMABLE LOGIC ARRAY INTEGRATED CIRCUITS." That patent is incorporated herein by reference for all purposes. Additional discussion of the FLEX 10K and other PLD products may be found in other publications from Altera Corporation of San Jose, Calif.

Briefly, in the FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ASICs that can benefit from application of the present invention.

Figure 10:
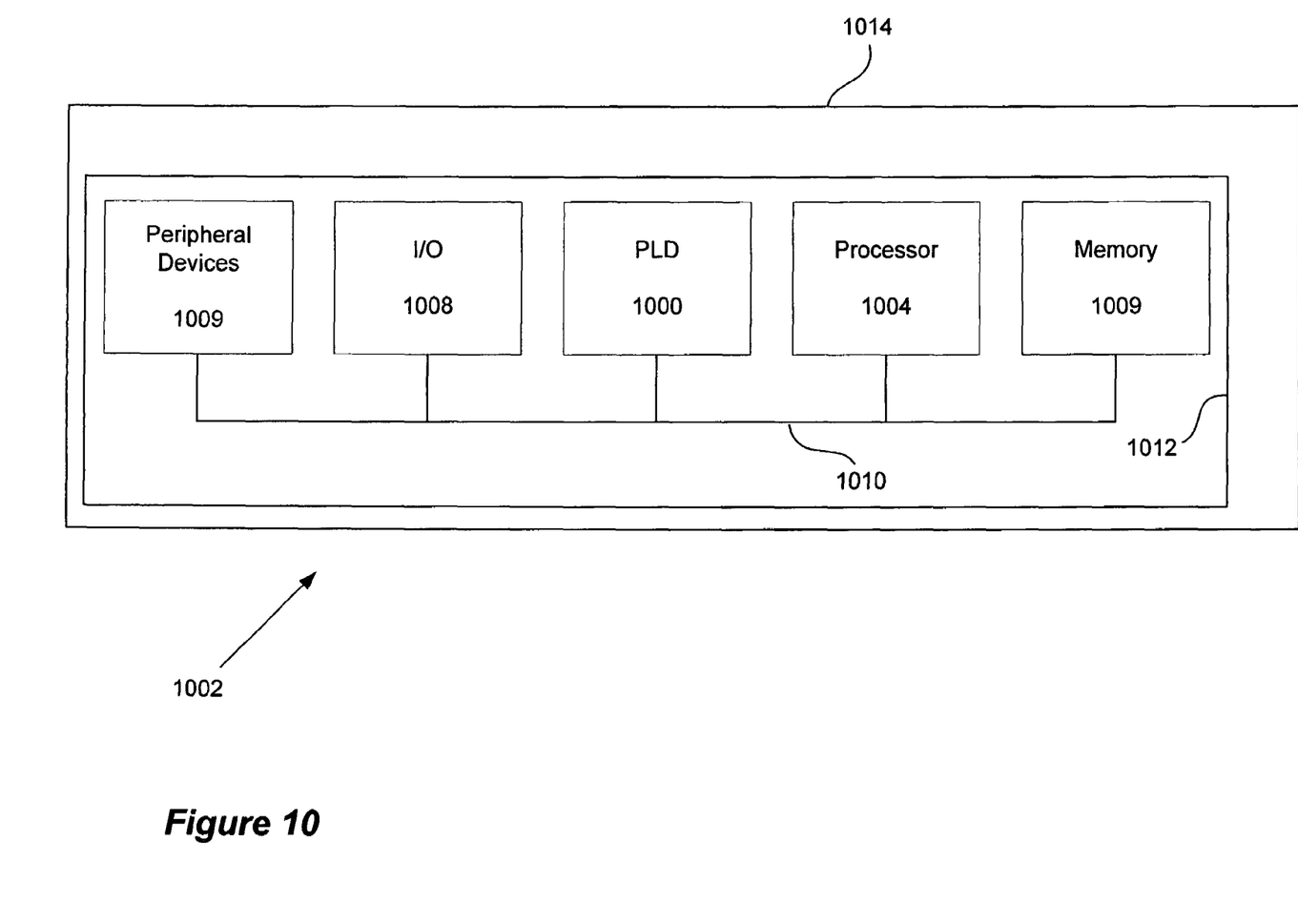
FIG. 10 is a block diagram depicting a system containing a PLD prepared in accordance with this invention.

This invention also relates to programmable logic and other devices programmed with a design prepared in accordance with the above described methods and/or using a computer program product according to one or more embodiments of the present invention. The invention further relates to systems employing such programmable logic devices. FIG. 10 illustrates a PLD 1000 of the present invention in a data processing system 1002. The data processing system 1002 may include one or more of the following components: a processor 1004; memory 1006; I/O circuitry 1008; and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital signal processing, or any other application where the advantage of using reprogrammable logic is desirable. The PLD 1000 can be used to perform a variety of different logic functions.

The present invention makes the Farrow structure more robust and capable of dealing with discrepancies with nominal clock values and drift and/or jitter of sampling rates. This improved Farrow structure can now be used in cases where it previously was not possible to use the Farrow architecture, namely where two clocks are truly independent of each other (for example, where they are not derived from the same PLL).

The many features and advantages of the present invention are apparent from the written description, and thus, the appended claims are intended to cover all such features and advantages of the invention. Further, since numerous modifications and changes will readily occur to those skilled in the art, the present invention is not limited to the exact construction and operation illustrated and described. Therefore, the described embodiments are illustrative and not restrictive, and the invention should not be limited to the details given herein but should be defined by the following claims and their full scope of equivalents, whether foreseeable or unforeseeable now or in the future.

What is claimed is:

1. A sampling rate converter comprising:
   an input configured to receive data;
   a Farrow structure coupled to the input, wherein the Farrow structure comprises a phase offset generator;
   an output transition interface coupled to the Farrow structure; and
   a phase offset adjuster coupled to the transition interface and to the phase offset generator;
   wherein the phase offset adjuster measures data flow across the transition interface to generate a measured data flow value; and
   further wherein the phase offset adjuster generates a phase offset adjustment value based on the measured data flow value and provides the phase offset adjustment value to the phase offset generator.

2. The sampling rate converter of claim 1 wherein the phase offset generator is initially set to a nominal phase offset based on a nominal input sampling rate and a nominal output sampling rate.

3. The sampling rate converter of claim 1 wherein the phase offset adjuster comprises:
   a collector coupled to the transition interface, the collector configured to collect the measured data flow value;
   a comparator coupled to the collector, the comparator configured to calculate the difference between the measured data flow value and a target data flow value; and
   a phase offset adjustment value generator coupled to the comparator and the phase offset generator, the phase offset adjustment value generator configured to calculate the phase offset value based on a variance of the measured data flow value from the target data flow value.

4. The sampling rate converter of claim 3 wherein the transition interface is a FIFO buffer; and
   further wherein the target data flow value is a range of permitted data flow values for the FIFO buffer.

5. The sampling rate converter of claim 4 wherein the measured data flow value is a data balance value representing the number of data words held in the FIFO buffer and further wherein the target data flow is a range of permitted data balance values for the FIFO buffer.

6. The sampling rate converter of claim 1 wherein the transition interface is a FIFO buffer and further wherein the phase offset adjuster comprises:
   a counter coupled to the FIFO buffer, the counter configured to maintain a measured data flow value by incrementing the measured data flow value for each data word written to the FIFO and decrementing the measured data flow value for every data word read from the FIFO;
   a phase offset adjustment value generator coupled to the counter and the phase offset generator, the phase offset adjustment value generator configured to calculate the phase offset adjustment value based on the variance of the measured data flow value from a target data flow value.

7. The sampling rate converter of claim 6 wherein the target data flow value is a range of permitted data flow values for the FIFO buffer.

8. The sampling rate converter of claim 1 implemented on a programmable logic device (PLD).

9. A method of adjusting the operation of a sampling rate converter, the method comprising:
   (a) setting a phase offset value for a Farrow structure;
   (b) measuring a data flow value at a sampling rate conversion transition interface;
   (c) generating a phase offset adjustment value based on a variance between the measured data flow value and a target data flow value;
   (d) adjusting the phase offset value by adding or subtracting the phase offset adjustment value.

10. The method of claim 9 wherein the phase offset value is initially set at a nominal phase offset value based on a nominal input sampling rate and a nominal output sampling rate; and
    further wherein the measured data flow is representative of at least one of the following:
    the difference between the nominal input sampling rate and an actual input sampling rate; or
    the difference between the nominal output sampling rate and an actual output sampling rate.

11. The method of claim 9 wherein measuring a data flow value at a sampling rate conversion transition interface comprises measuring the data balance value of a FIFO buffer at the transition interface.

12. The method of claim 11 wherein the data balance value of the FIFO buffer is the number of data words stored in the FIFO buffer.

13. The method of claim 9 wherein measuring a data flow value at a sampling rate conversion transition interface comprises collecting a counter data flow value from a counter coupled to a FIFO buffer at the transition interface, wherein the counter is configured to maintain the net data flow value by incrementing the net data flow value for each data word written to the FIFO and decrementing the net data flow value for every data word read from the FIFO.

14. The method of claim 9 wherein the transition interface is an output FIFO buffer.

15. The method of claim 9 wherein the target data flow value is a range of acceptable data flow values.

16. The method of claim 15 wherein a phase offset adjustment value is generated only when the measured data flow value falls outside the range of acceptable data flow values.

17. The method of claim 9 wherein generating the phase offset adjustment value comprises calculating and scaling the difference between the measured data flow value and the target data flow value.

18. The method of claim 9 wherein steps (b), (c) and (d) are performed iteratively to update the phase offset value periodically.

19. A computer program product comprising a machine readable medium on which is provided program instructions for adjusting the operation of a sampling rate converter, the program instructions comprising:
   instructions for setting a phase offset value for a Farrow structure;
   instructions for measuring a data flow value at a sampling rate conversion transition interface;
   instructions for generating a phase offset adjustment value based on a variance between the measured data flow value and a target data flow value; and
   instructions for adjusting the phase offset value by adding or subtracting the phase offset adjustment value.

20. The computer program product of claim 19 wherein the phase offset value is initially set at a nominal phase offset value based on a nominal input sampling rate and a nominal output sampling rate; and
   further wherein the measured net data flow is representative of at least one of the following:
      the difference between the nominal input sampling rate and an actual input sampling rate; or
      the difference between the nominal output sampling rate and an actual output sampling rate.

21. The computer program product of claim 19 wherein measuring the data flow value at the sampling rate conversion transition interface comprises measuring the data balance value of a first in first out (FIFO) buffer at the transition interface.

22. The computer program product of claim 21 wherein the data balance value of the FIFO buffer is the number of data words stored in the FIFO buffer.

23. The computer program product of claim 19 wherein measuring the data flow value at the sampling rate conversion transition interface comprises collecting a counter data flow value from a counter coupled to a FIFO buffer at the transition interface, wherein the counter is configured to maintain a net data flow value by incrementing the net data flow value for each data word written to the FIFO and decrementing the net data flow value for every data word read from the FIFO.

24. The computer program product of claim 19 wherein the transition interface is an output FIFO buffer.

25. The computer program product of claim 19 wherein the target data flow value is a range of acceptable data flow values.

26. The computer program product of claim 25 wherein a phase offset adjustment value is generated only when the measured data flow value falls outside the range of acceptable data flow values.

27. The computer program product of claim 19 wherein generating the phase offset adjustment value comprises calculating and scaling the difference between the measured data flow value and the target data flow value.

28. A phase offset adjustment system for a Farrow structure having a phase offset generator and an output FIFO buffer, the system comprising:
   a collector for collecting a measured data flow value representing the number of data words stored in the FIFO buffer;
   a comparator coupled to the collector and configured to compare the number of data words measured in the FIFO buffer with a data balance target range; and
   a phase offset adjustment value generator coupled to the comparator and the phase offset generator, the phase offset adjustment value generator configured to calculate a phase offset adjustment value when the number of data words measured in the FIFO buffer falls outside the data balance target range.

29. A phase offset adjustment system for a Farrow structure having a phase offset generator and an output FIFO buffer, the system comprising:
   a counter for maintaining a measured data flow value representing the number of data words written to and read from the FIFO buffer by incrementing the measured data flow value for each data word written to the FIFO and decrementing the measured data flow value for every data word read from the FIFO;
   a comparator coupled to the counter and configured to compare the measured data flow value with a target data flow value; and
   a phase offset adjustment value generator coupled to the comparator and the phase offset generator, the phase offset adjustment value generator configured to calculate a phase offset adjustment value when the measured data flow value falls outside a net number target range.

* * * * *